(12) United States Patent
Tang et al.

(10) Patent No.: US 10,057,473 B2
(45) Date of Patent: Aug. 21, 2018

(54) CIRCUIT BOARD DEVICE AND IMAGE CAPTURING MODULE HAVING THE CIRCUIT BOARD DEVICE

(71) Applicant: SZ DJI TECHNOLOGY CO., LTD., Shenzhen (CN)

(72) Inventors: Yin Tang, Shenzhen (CN); Hualiang Qiu, Shenzhen (CN); Feihu Yang, Shenzhen (CN)

(73) Assignee: SZ DJI TECHNOLOGY CO., LTD., Shenzhen (CN)

( * ) Notice: Subject to any disclaimer, the term of this patent is extended or adjusted under 35 U.S.C. 154(b) by 7 days.

(21) Appl. No.: 15/388,814

(22) Filed: Dec. 22, 2016

(65) Prior Publication Data

US 2017/0104906 A1    Apr. 13, 2017

Related U.S. Application Data

(63) Continuation of application No. PCT/CN2014/081055, filed on Jun. 27, 2014.

(51) Int. Cl.
| | |
|---|---|
| *H04N 5/225* | (2006.01) |
| *H05K 1/14* | (2006.01) |
| *H05K 7/14* | (2006.01) |

(52) U.S. Cl.
CPC ......... *H04N 5/2257* (2013.01); *H04N 5/2252* (2013.01); *H04N 5/2253* (2013.01); *H04N 5/2254* (2013.01); *H05K 1/142* (2013.01); *H05K 1/148* (2013.01); *H05K 7/14* (2013.01)

(58) Field of Classification Search
None
See application file for complete search history.

(56) References Cited

U.S. PATENT DOCUMENTS

| 4,711,548 A | 12/1987 | Arakawa et al. | |
|---|---|---|---|
| 2008/0186584 A1* | 8/2008 | Ballard | F41G 1/383 359/611 |
| 2015/0312468 A1* | 10/2015 | Taylor | H04N 13/0239 348/47 |

FOREIGN PATENT DOCUMENTS

| CN | 2632971 Y | 8/2004 | |
|---|---|---|---|
| CN | 101887506 | * 11/2010 | ............... G06K 7/10 |
| CN | 101887506 A | 11/2010 | |
| CN | 101894247 A | 11/2010 | |
| CN | 202872939 U | 4/2013 | |
| CN | 103517585 A | 1/2014 | |
| CN | 203661415 U | 6/2014 | |

OTHER PUBLICATIONS

The World Intellectual Property Organization (WIPO) International Search Report for PCT/CN2014/081055 dated Nov. 28, 2014 p. 1-6

* cited by examiner

*Primary Examiner* — Stephen Coleman
(74) *Attorney, Agent, or Firm* — Anova Law Group, PLLC

(57) ABSTRACT

A circuit board device includes a polyhedral support frame and a circuit board unit. The circuit board unit includes two rigid boards and a flexible board connecting the two rigid boards. The two rigid boards are folded with respect to each other through the flexible board and are disposed on different sides of the support frame, respectively.

19 Claims, 5 Drawing Sheets

CIRCUIT BOARD DEVICE AND IMAGE CAPTURING MODULE HAVING THE CIRCUIT BOARD DEVICE

CROSS-REFERENCE TO RELATED APPLICATION

This is a continuation application of International Application No. PCT/CN2014/081055, filed on Jun. 27, 2014, the entire contents of which are incorporated herein by reference.

TECHNICAL FIELD

The present disclosure relates to a circuit board device and an image capturing module having the circuit board device.

BACKGROUND

Image capturing modules, such as cameras and surveillance cameras, may be manufactured in a compact design with a minimized volume. An existing image capturing module may comprise a lens module for capturing optical images and a circuit board connected to the lens module. A plurality of functional modules for enabling various functions, for example, a photoelectric conversion module, an image processing module, an image transmission module, a power supply module, and a control module, may be provided on the circuit board. The circuit board may need a large size to accommodate the functional modules, increasing a volume of the image capturing module.

SUMMARY

In view of the above, there exists a need to provide a circuit board device having a compact structure and an image capturing module having the circuit board device.

In accordance with the present disclosure, there is provided a circuit board device including a polyhedral support frame and a circuit board unit. The circuit board unit includes two rigid boards and a flexible board connecting the two rigid boards. The two rigid boards are folded with respect to each other through the flexible board and are disposed on different sides of the support frame, respectively.

In some embodiments, each of the rigid boards includes a plurality of positioning through-holes configured to position the rigid boards on the support frame. The support frame includes a plurality of positioning structures, each corresponding to one of the positioning through-holes. The positioning structures and the corresponding positioning through-holes are configured to cooperatively position the rigid boards on the support frame.

In some embodiments, each of the positioning structures includes a convex column having an internal thread.

In some embodiments, the support frame includes a hollow frame structure within which a receiving portion for receiving electric elements is formed.

In some embodiments, the support frame includes an opening on one side of the support frame. The opening is in communication with the receiving portion.

Also in accordance with the present disclosure, there is provided an image capturing module including a camera unit and a circuit board device connected to the camera unit. The circuit board device includes a polyhedral support frame and a circuit board unit including two rigid boards and a flexible board connecting the two rigid boards. The two rigid boards are folded with respect to each other through the flexible board and are disposed on different sides of the support frame, respectively.

In some embodiments, each of the rigid boards includes a plurality of positioning through-holes configured to position the rigid boards on the support frame. The support frame includes a plurality of positioning structures, each corresponding to one of the positioning through-holes. The positioning structures and the corresponding positioning through-holes are configured to cooperatively position the rigid boards on the support frame.

In some embodiments, each of the positioning structures includes a convex column having an internal thread.

In some embodiments, the support frame includes a hollow frame structure within which a receiving portion is formed. The camera unit is received in the receiving portion.

In some embodiments, the support frame includes an opening on one side of the support frame. The opening is in communication with the receiving portion.

In some embodiments, the camera unit includes an optical lens and an image sensing module arranged at an imaging side of the optical lens. The image sensing module is electrically connected to the circuit board device.

In some embodiments, the image capturing module further includes a housing having a receiving space formed therein and including a lens aperture. The camera unit and the circuit board device are received in the housing. An object side of the camera unit faces the lens aperture.

In some embodiments, the housing includes a mounting portion for mounting the image capturing module on a gimbal.

In some embodiments, the mounting portion is formed at a joint of the first casing and the second casing.

In some embodiments, the housing includes a first casing and a second casing connected to the first casing. The first casing and the second casing collectively enclose the receiving space. The support frame is fixed on the first casing.

In some embodiments, the image capturing module further includes a plurality of first connecting portions formed on an inner wall of the first casing and a plurality of second connecting portions formed on a periphery of the support frame. Each of the second connecting portions corresponding to one of the first connecting portions. The first connecting portions and the second connecting portions are configured to cooperatively fix the support frame.

In some embodiments, each of the first connecting portions includes a convex column having an internal thread. Each of the second connecting portions includes a sheet structure protruding from the periphery of the support frame and has a connecting hole. The connecting hole of each of the second connecting portions is aligned with the internal thread of the corresponding first connecting portion.

In some embodiments, the lens aperture is provided at a joint of the first casing and the second casing.

Compared to the existing technologies, a circuit board device of present disclosure may comprise a polyhedral support frame and a circuit board unit formed of a plurality of rigid boards connected by flexible boards. The rigid boards may be foldable with respect to each other and disposed on different sides of the support frame by virtue of a flexibility of the flexible boards. Therefore, the circuit board unit may be provided in a three-dimensional space, thus effectively improving a space utilization. The circuit board device may have a compact structure and a reduced volume. The image capturing module having the circuit board device may also have a compact structure and a reduced volume.

LIST OF REFERENCE NUMERALS

Figure 1:
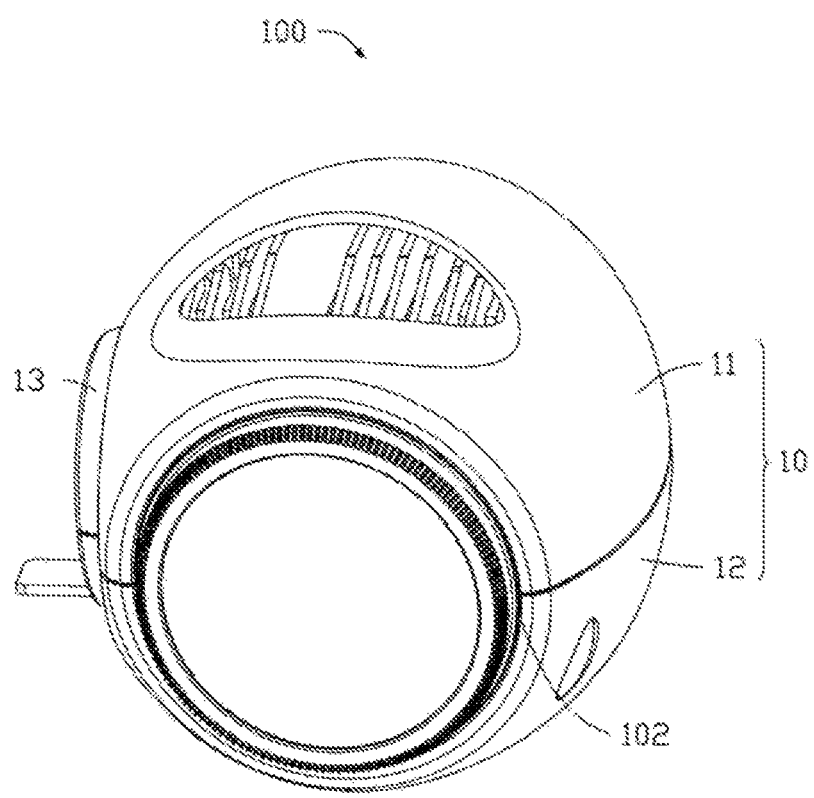
FIG. 1 is a perspective view of an image capturing module according to an embodiment of the present disclosure.

Image capturing module 100
Housing 10
Receiving space 101
Lens aperture 102
First casing 11
First connecting portion 111
Second casing 12
Mounting portion 13
Camera unit 20
Optical lens 21
Image sensing module 22
Circuit board device 30
Circuit board unit 31
Rigid board 311
Functional module 3111
Positioning through-hole 3112
First rigid board 311a
Second rigid board 311b
Third rigid board 311c
Fourth rigid board 311d
Flexible board 312
Support frame 32
Receiving portion 320
First side 321
Opening 3211
Second side 322
Third side 323
Fourth side 324
Fifth side 325
Sixth side 326
Positioning structure 327
Second connecting portion 328
Connecting hole 3281
First connector 40
Second connector 50

Embodiments of the present disclosure will be described in detail with reference to the drawings.

DETAILED DESCRIPTION OF EMBODIMENTS

Figure 2:
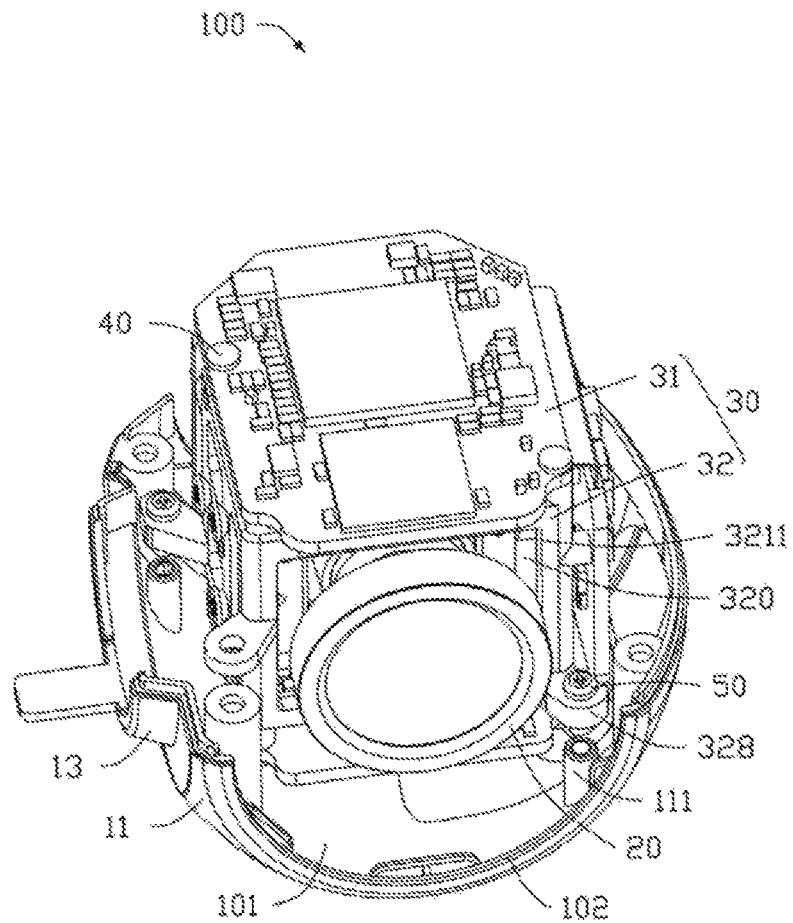
FIG. 2 is an exploded view of the image capturing module in FIG. 1.
Figure 3:
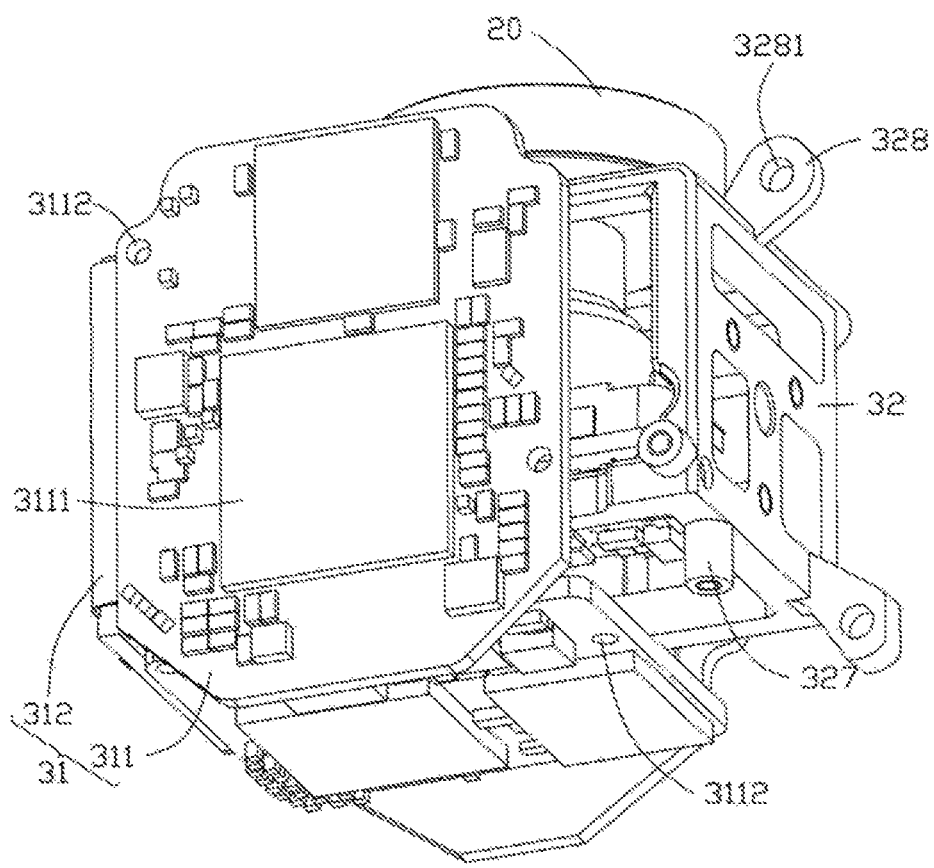
FIG. 3 is a further exploded view of the image capturing module in FIG. 2.

Referring to FIGS. 1-2, an image capturing module 100 according to an embodiment of the present disclosure may comprise a housing 10, a camera unit 20 provided in the housing 10, and a circuit board device 30 provided in the housing 10. In some embodiments, the image capturing module 100 may be, for example, a camera device for aerial filming, which may be operated to perform aerial filming using a remote controller and to wirelessly transmit captured images to a ground receiving device (not shown).

In some embodiments, the housing 10 may comprise a first casing 11 and a second casing 12 connected to the first casing 11. The first casing 11 and the second casing 12 may collectively enclose a receiving space 101 for receiving the camera unit 20 and the circuit board device 30. The housing 10 may include a lens aperture 102 in communication with the receiving space 101. The camera unit 20 may capture images through the lens aperture 102. In some embodiments, the lens aperture 102 may be provided at a location where the first casing 11 and the second casing 12 join each other, i.e., where the first and second casings 11, 12 contact and connect to each other. For example, a portion of the lens aperture 102 may be provided on the first casing 11, and the other portion of the lens aperture 102 may be provided on the second casing 12. In other embodiments, the lens aperture 102 may be provided on the first casing 11 or the second casing 12. A plurality of first connecting portions 111 for connecting the circuit board device 30 may be provided on an inner wall of the first casing 11. In some embodiments, each of the first connecting portions 111 may be a convex column having an internal thread. In some embodiments, the housing 10 formed by the first casing 11 and the second casing 12 may be substantially spherical. In other embodiments, the housing 10 may be in another shape, such as a cuboidal shape, a conical shape, or another polyhedral shape.

The housing 10 may comprise a mounting portion 13 for mounting the image capturing module 100 onto a carrier such as a gimbal (not shown). In some embodiments, the mounting portion 13 may be formed at a location where the first casing 11 and the second casing 12 join each other. For example, a portion of the mounting portion 13 may be provided on the first casing 11, and the other portion of the mounting portion 13 may be provided on the second casing 12. In other embodiments, the mounting portion 13 may be formed on the casing 11 or the second casing 12.

Figure 4:
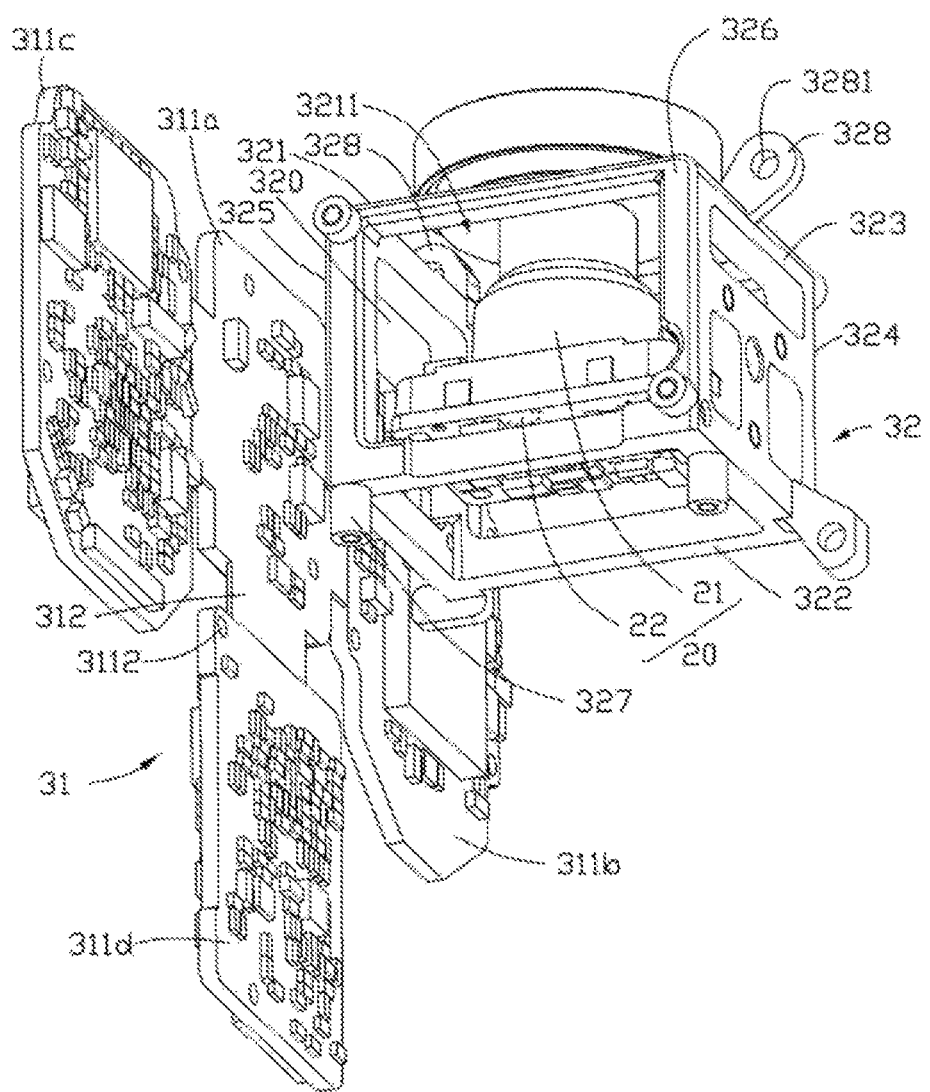
FIG. 4 is a further exploded view of the image capturing module in FIG. 3.
Figure 5:
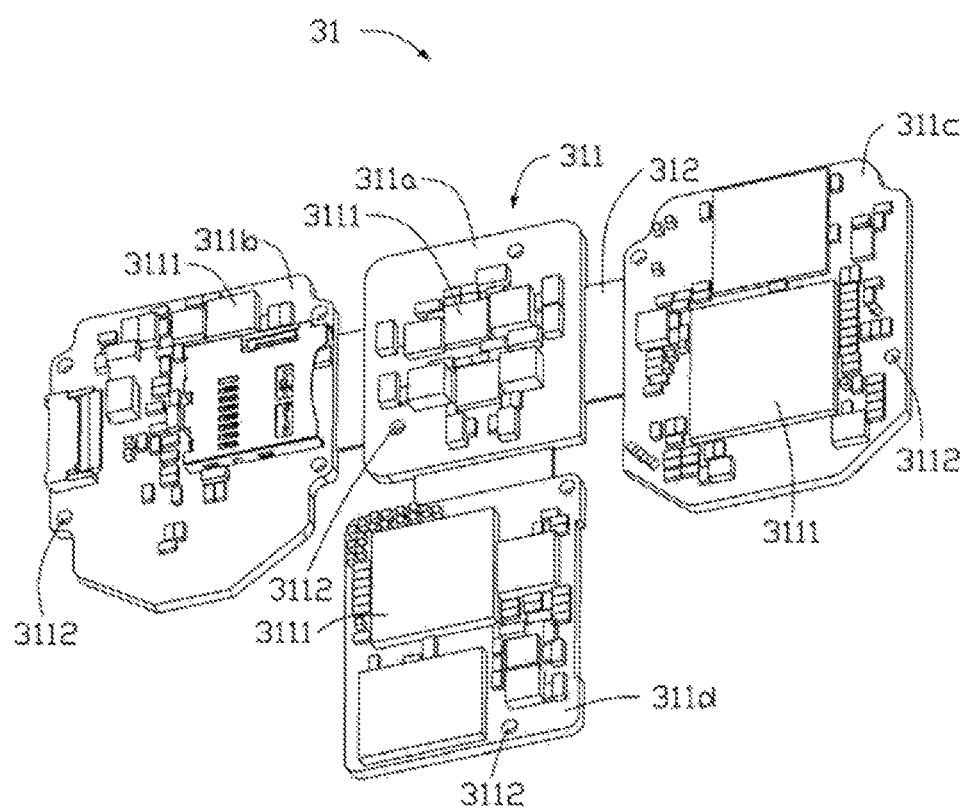
FIG. 5 shows a circuit board unit of the image capturing module in FIG. 3, viewed from another angle.

Referring to FIGS. 2 and 4, the camera unit 20 may comprise an optical lens 21 and an image sensing module 22 arranged at an imaging side of the optical lens 21. The optical lens 21 may capture optical images. The image sensing module 22 may be configured to sense the optical images captured by the optical lens 21 and perform a photoelectric conversion. In some embodiments, the image sensing module 22 may be a Charge-coupled Device (CCD) image sensing module or a Complementary Metal Oxide Semiconductor (CMOS) image sensing module.

Referring to FIGS. 2-5, the circuit board device 30 may comprise a circuit board unit 31 and a support frame 32. In some embodiments, the circuit board unit 31 may comprise a plurality of rigid boards 311 and a plurality of flexible boards 312 connecting the rigid boards 311. The flexible boards 312 are soft and can be folded. A functional module 3111 may be provided on each of the rigid boards 311, and the functional modules 3111 on different rigid board 311 may enable different functions of the image capturing module 100. Each of the rigid boards 311 may include a plurality of positioning through-holes 3112, through which the rigid boards 311 may be positioned on the support frame 32. In some embodiments, four rigid boards 311 are provided, i.e., a first rigid board 311a, a second rigid board 311b, a third rigid board 311c, and a fourth rigid board 311d. In some embodiments, the second rigid board 311b, the third rigid board 311c, and the fourth rigid board 311d may be disposed on different sides of the first rigid board 311a, respectively, and may be connected to the first rigid board 311a through flexible boards 312, respectively. For example, the first rigid board 311a and the functional module 3111 provided thereon may implement an image processing function of the image capturing module 100, the second board 311b and the functional module 3111 provided thereon may implement an image transmission function of the image capturing module 100, the third rigid board 311c and the functional module 3111 provided thereon may implement a gimbal control function of the image capturing module 100, and the fourth rigid board 311d and the functional module 3111 provided thereon may implement a power management function of the image capturing module 100.

In some embodiments, the number of rigid boards 311 may vary according to different practical needs. In some embodiments, the function of each of the rigid boards 311 and the corresponding functional module 3111 thereof may vary according to different needs, without being limited to any specific embodiment described herein.

In some embodiments, each flexible board 312 may be a flexible circuit board having a bendable circuit therein. The flexible boards 312 may mechanically and electrically connect different rigid boards 311 to each other. Further, using a flexible board 312, a predetermined angle may be formed between two adjacent rigid boards 311 connected by the flexible board 312.

The support frame 32 may be a generally hollow polyhedral frame. An interior of the support frame 32 forms a receiving portion 320. In some embodiments, the support frame 32 may be a generally hexahedral frame. The support frame 32 may comprise a first side 321, a second side 322 opposite to the first side 321, a third side 323, a fourth side 324, a fifth side 325, and a sixth side 326. The third side 232, the fourth side 324, the fifth side 325, and the sixth side 326 may be successively connected to each other and located between the first side 321 and the second side 322. The first side 321 may include an opening 3211 in communication with the receiving portion 320.

A plurality of positioning structures 327 may be formed on each of the second side 322, the fourth side 324, the fifth side 325 and the sixth side 326. The positioning structures 327 formed on the second side 322 may correspond to the positioning through-holes 3112 formed on the fourth rigid board 311d. The positioning structures 327 formed on the fourth side 324 may correspond to the positioning through-holes 3112 formed on the second rigid board 311b. The positioning structures 327 formed on the fifth side 325 may correspond to the positioning through-holes 3112 formed on the first rigid board 311a. The positioning structures 327 formed on the sixth side 326 may correspond to the positioning through-holes 3112 formed on the third rigid board 311c. In some embodiments, each of the positioning structures 327 may include a convex column with an internal thread.

A plurality of second connecting portions 328 corresponding to the first connecting portions 111 may be provided on a periphery of the support frame 32. In some embodiments, each of the second connecting portions 328 may include a sheet structure protruding from the periphery of the support frame 32. A connecting hole 3281 may be provided on each of the second connecting portions 328.

Referring to FIGS. 1-5, during assembly, the camera unit 20 may be installed into the receiving portion 320 of the support frame 32 through the opening 3211 and fixed on the support frame 32. The circuit board unit 31 may be installed on the sides of the support frame 32. In some embodiments, the first rigid board 311a may be installed on the fifth side 325, the second rigid board 311b may be installed on the fourth side 324, the third rigid board 311c may be installed on the sixth side 326, and the fourth rigid board 311d may be installed on the second side 322. Since the rigid boards 311 are connected through the flexible boards 312, an angle may be formed between adjacent rigid boards 311. Therefore, the rigid boards 311 may be disposed on the different sides of the support frame 32. The positioning through-holes 3112 of each of the rigid boards 311 may match the corresponding positioning structures 327 to position the rigid board 311. In some embodiments, for each of the positioning through-holes 3112, a first connector 40 may be provided (FIG. 2). The first connector 40 may extend through the corresponding positioning through-hole 3112 and be fixedly connected to a corresponding positioning structure 327 to fix a corresponding rigid board 311 on the support frame 32. After the camera unit 20 and the circuit board unit 31 are installed on the support frame 32, an adapter cable (not shown) may be used to electrically connect the image sensing module 22 of the camera unit 20 with the circuit board unit 31. After the camera unit 20 and the circuit board device 30 are assembled with each other, the support frame 32 may be placed in the receiving space 101 of the housing 10. The optical lens 21 may be oriented toward the lens aperture 102, and the second connecting portions 328 may be aligned with corresponding first connecting portions 111, respectively. In some embodiments, each of the second connecting portions 328 may be connected to a corresponding first connecting portion 111 through a second connector 50 so as to fix the support frame 32 within the housing 10. The first casing 11 and the second casing 12 may then be fastened to each other. In some embodiments, the fastened first casing 11 and second casing 12 may be further connected to each other by glue, screws (not shown), or the like.

The circuit board device 30 of present disclosure may comprise the polyhedral support frame 30 and the circuit board unit 31 formed by the plurality of rigid boards 312 connected to each other by the flexible boards 312. The flexibility of the flexible boards 312 allows adjacent rigid boards 311 to fold with respect to each other and be disposed on different sides of the support frame 32. Therefore, the circuit board unit 31 may be provided in a three-dimensional space, thus effectively improving a space utilization. The circuit board device 30 may have a compact structure and a reduced volume. Consequently, the image capturing module 100 having the circuit board device 30 may also have a compact structure and a reduced volume.

It may be appreciated that those skilled in the art may make various modifications without departing from the spirit and technical effect of the disclosure. Those modifications made according to the spirit of the present disclosure shall fall into the scope of the invention as claimed.

What is claimed is:

1. A circuit board device, comprising:
   a polyhedral support frame, each side of the polyhedral support frame including an opening; and
   a circuit board unit comprising at least two rigid boards and at least one flexible board connecting the at least two rigid boards,
   wherein the at least two rigid boards are folded with respect to each other through the at least one flexible board and are disposed on different sides of the support frame, respectively.

2. The circuit board device of claim 1, wherein the at least two rigid boards include at least four rigid boards folded with respect to each other through the at least one flexible board and disposed on different sides of the support frame, respectively.

3. The circuit board device of claim 1, wherein:
each of the rigid boards includes a plurality of positioning through-holes configured to position the rigid boards on the support frame, and
the support frame includes a plurality of positioning structures, each corresponding to one of the positioning through-holes, the positioning structures and the corresponding positioning through-holes being configured to cooperatively position the rigid boards on the support frame.

4. The circuit board device of claim 3, wherein each of the positioning structures includes a convex column having an internal thread and protruding from a side of the support frame along a longitudinal direction of the convex column.

5. The circuit board device of claim 1, wherein the support frame includes a hollow frame structure within which a receiving portion for receiving electric elements is formed.

6. The circuit board device of claim 5, wherein the opening on each side of the support frame is in communication with the receiving portion.

7. An image capturing module, comprising:
a camera unit; and
a circuit board device connected to the camera unit, the circuit board device comprising:
a polyhedral support frame, each side of the polyhedral support frame including an opening; and
a circuit board unit comprising two rigid boards and a flexible board connecting the two rigid boards,
wherein the two rigid boards are folded with respect to each other through the flexible board and are disposed on different sides of the support frame, respectively.

8. The image capturing module of claim 7, wherein:
the camera unit comprises an optical lens and an image sensing module arranged at an imaging side of the optical lens, and
the image sensing module is electrically connected to the circuit board device.

9. The image capturing module of claim 7, wherein:
each of the rigid boards includes a plurality of positioning through-holes configured to position the rigid boards on the support frame, and
the support frame includes a plurality of positioning structures, each corresponding to one of the positioning through-holes, the positioning structures and the corresponding positioning through-holes being configured to cooperatively position the rigid boards on the support frame.

10. The image capturing module of claim 9, wherein each of the positioning structures includes a convex column having an internal thread.

11. The image capturing module of claim 7, wherein:
the support frame includes a hollow frame structure within which a receiving portion is formed, and
the camera unit is received in the receiving portion.

12. The image capturing module of claim 11, wherein the opening on each side of the support frame is in communication with the receiving portion.

13. The image capturing module of claim 7, further comprising:
a housing having a receiving space formed therein, the housing including a lens aperture, wherein:
the camera unit and the circuit board device are received in the housing, and
an object side of the camera unit faces the lens aperture.

14. The image capturing module of claim 13, wherein the lens aperture is provided at a joint of the first casing and the second casing.

15. The image capturing module of claim 13, wherein the housing comprises a mounting portion for mounting the image capturing module on a gimbal.

16. The image capturing module of claim 15, wherein the mounting portion is formed at a joint of the first casing and the second casing.

17. The image capturing module of claim 13, wherein the housing comprises a first casing and a second casing connected to the first casing, the first casing and the second casing collectively enclose the receiving space, and the support frame is fixed on the first casing.

18. The image capturing module of claim 17, further comprising:
a plurality of first connecting portions formed on an inner wall of the first casing; and
a plurality of second connecting portions formed on a periphery of the support frame, each of the second connecting portions corresponding to one of the first connecting portions,
wherein the first connecting portions and the second connecting portions are configured to cooperatively fix the support frame.

19. The image capturing module of claim 18, wherein:
each of the first connecting portions includes a convex column having an internal thread,
each of the second connecting portions includes a sheet structure protruding from the periphery of the support frame and has a connecting hole, and
the connecting hole of each of the second connecting portions is aligned with the internal thread of the corresponding first connecting portion.

* * * * *